(12) United States Patent
Bandic et al.

(10) Patent No.: US 7,377,765 B2
(45) Date of Patent: May 27, 2008

(54) SYSTEM, METHOD, AND APPARATUS FOR NON-CONTACT AND DIFFUSE CURING EXPOSURE FOR MAKING PHOTOPOLYMER NANOIMPRINTING STAMPER

(75) Inventors: Zvonimir Z. Bandic, San Jose, CA (US); Tsai-Wei Wu, San Jose, CA (US)

(73) Assignee: Hitachi Global Storage Technologies, Amsterdam (NL)

( * ) Notice: Subject to any disclaimer, the term of this patent is extended or adjusted under 35 U.S.C. 154(b) by 243 days.

(21) Appl. No.: 11/353,476

(22) Filed: Feb. 14, 2006

(65) Prior Publication Data

US 2007/0190196 A1    Aug. 16, 2007

(51) Int. Cl.
*B29C 59/00* (2006.01)
(52) U.S. Cl. .................. 425/385; 425/174.4; 425/388; 264/259; 264/319; 264/496
(58) Field of Classification Search ........ 425/DIG. 47, 425/385, 388, 174.4, 387.1; 264/259, 319, 264/496
See application file for complete search history.

(56) References Cited

U.S. PATENT DOCUMENTS

| 7,259,827 B2* | 8/2007 | Dierichs .................... 355/30 |
| 2002/0186649 A1 | 12/2002 | Feist et al. |
| 2003/0159608 A1* | 8/2003 | Heidari ..................... 101/494 |
| 2005/0087911 A1 | 4/2005 | Ford |
| 2006/0246169 A1* | 11/2006 | Chen et al. ................. 425/385 |
| 2007/0158866 A1* | 7/2007 | Wu ........................... 264/1.33 |

FOREIGN PATENT DOCUMENTS

| JP | 56037836 | 4/1981 |
| JP | 59001222 | 1/1984 |
| JP | 61151855 | 7/1986 |
| JP | 1133238 | 5/1989 |
| JP | 1163024 | 6/1989 |
| JP | 2166645 | 6/1990 |
| JP | 3242840 | 10/1991 |
| JP | 5198018 | 8/1993 |
| JP | 6162578 | 6/1994 |
| JP | 8106655 | 4/1996 |
| JP | 2002304779 | 10/2002 |
| JP | 2004192700 | 7/2004 |
| JP | 2004330680 | 11/2004 |

* cited by examiner

*Primary Examiner*—Robert B. Davis
*Assistant Examiner*—Maria Veronica Ewald
(74) *Attorney, Agent, or Firm*—Bracewell & Giuliani LLP

(57) ABSTRACT

A nanoimprinting configuration includes a UV light diffuser that randomizes a collimated UV light beam so as to diffuse the shadowing effect from any defect object that resides in the UV optical path. In addition, a combination center circular pad and outer ring-shaped pad form a donut-shaped "non-contact" area between the two pad pieces. The size and shape of the two pad combination are designed to avoid direct gel pad contact above the patterned imprint zone on the disk substrate. The purpose of the gel pad, non-contact configuration is to eliminate any possible surface deformation incurred along the loading column and thereby avoid the elastic propagation of any deformations to the stamper resist surface.

14 Claims, 6 Drawing Sheets

SYSTEM, METHOD, AND APPARATUS FOR NON-CONTACT AND DIFFUSE CURING EXPOSURE FOR MAKING PHOTOPOLYMER NANOIMPRINTING STAMPER

BACKGROUND OF THE INVENTION

1. Technical Field

The present invention relates in general to nanoimprinting and, in particular, to an improved system, method, and apparatus for providing a non-contact, diffuse exposure for making a photopolymer nanoimprinting stamper.

2. Description of the Related Art

Nanoimprinting may be the most feasible technology for enabling the concept of patterning recording media into products. However, because of the extremely high cost to fabricate a master, direct imprinting by using the original master to mass produce disk replicas would be lifetime limited. There also would be a high risk of damaging the original master during the imprinting operation.

One method of overcoming these challenges is to use a "daughter master" in which the disk replica imprinting is separated into two stages. In the first stage, the original master is used to create numerous, inexpensive daughter stampers. Then, in the second stage, the daughter stampers are used to imprint many disk replicas.

For example, FIGS. 1-4 depict one method of fabricating daughter stampers. As shown in FIG. 1, a droplet of stamper resist 21 is positioned on an original silicon master 23, which is spaced apart from a stamper backing plate 25 having a gel pad 27. Under pressure (FIG. 2), the plate 25 contacts and distributes the resist 21 across master 23. As shown in FIG. 3, a UV cure 29 then cures the resist 21 to form a patterned stamper layer 30 (FIG. 4) or daughter master/stamper on the plate 25.

Referring now to FIGS. 5-8, one method of a disk replica imprinting process is described. As shown in FIG. 5, a droplet of replica resist 31 is positioned on a substrate 33, which is spaced apart from the daughter stamper 30 on plate 25 and gel pad 27. Under pressure (FIG. 6), the daughter stamper 30 contacts and distributes the resist 31 across substrate 33. As shown in FIG. 7, a UV cure 39 then cures the resist 31 to form a patterned replica layer 40 (FIG. 8) on the substrate 33.

Another problem that may be encountered during these fabrication processes is the formation of defects and undesirable stamper surface dimples. For example, as shown in FIGS. 9-11, the stamper backing plate 25 can accumulate defects or contaminants 41 (FIG. 9), such as debris, fibers, imperfections, etc. During the daughter stamper fabrication process (FIG. 10), the gel pad 27 and plate 25 are pressurized as shown. The contaminants 41 force bulges 43 to appear on the opposite surface of plate 25 on which they reside, in this case, the bottom of plate 25. This is due to the propagation of the elastic deformation of the plate 25. After UV curing 29, the surface bulges 43 introduce local spots that thin the daughter stamper 30 as shown. Upon releasing the pressure (FIG. 11), the bottom plate surface elastically recovers to its original shape (i.e., flat) and, as a result, the thin spots in the daughter stamper 30 form stamper dimples 45. The stamper dimples 45 cause undesirable base layer thickness non-uniformity on the imprinted replica, which then results in non-uniform pattern transfer to the disk substrates after RIE.

Yet another potential problem source occurs during the UV curing process of fabricating daughter stampers. As shown in FIG. 12, the UV radiation is emitted as a collimated beam. Any additional defects or contaminants 47, such as other types of debris or particles, form shadows 49 on the resist 21 when the collimated UV light 29 passes through the gel pad 27 and plate 25. These shadows 49 form areas 50 of uneven UV exposure intensity along the stamper layer/master interface and cause additional surface topography and, thus, surface imperfections. The unevenness in the UV light intensity is due to the shadowing effect of the contaminants 49 that reside in the path of the UV beam.

There is usually considerable volume shrinkage (about 10%) of a photopolymer after UV cure. In addition, the mechanical properties of the photopolymer also change with the polymerization process. This change is far more significant from the liquid to solid states than the volume shrinkage. Considering all of the changes of the resist properties that are progressing with the level of curing, it is expected that there is a rather complicated thermal-mechanical interaction and stress balancing acts between the shaded areas and the background photopolymer layer.

The replica thickness patch defects can have a significant negative impact on the quality of the disk replicas due to their relatively large size and high defect density. These defects can be easily detected from the background by the color contrast, which reflects their base layer thickness variations. The base layer thickness distribution among these defects ranges from about 50 to 200 nm, which is much thicker than that of the uniform area (about 20 nm or less). Consequently, these defects prevent a uniform pattern transfer during the reactive ion etch (RIE) process used to make patterned disk substrates.

It is almost impossible to completely remove the impurities embedded in the gel pad (e.g., air bubbles, impurities, etc.), surface defects (e.g., scratches) on plates, or airborne debris particles, etc., from an imprinting system. To demand perfect quality for every material in use and perfectly clean environment for the nanoimprinting operation is very costly if not impossible. Rather than perfecting everything involved in an imprinting operation, it would be more desirable to compensate for the root causes of the problems. Thus, an improved system, method, and apparatus for making photopolymer nanoimprinting stampers that avoid these issues would be desirable.

SUMMARY OF THE INVENTION

One embodiment of a system, method, and apparatus for a stamper configuration includes a loading column of a Mylar membrane, a quartz top plate, a gel pad, a stamper backing plate, stamper resist, and a silicon or quartz master. A UV light diffuser is inserted on top of the quartz plate. The purpose of the diffuser is to randomize the collimated UV light beam so as to diffuse the shadowing effect from any defect object that resides in the UV optical path.

In addition, the gel pad is configured into a combination center circular pad and outer ring-shaped pad instead of a conventional, single large circular pad. Thus, a donut-shaped "non-contact" area is formed between the two pad pieces. The size and shape of the two pad combination are designed to avoid direct gel pad contact above the patterned imprint zone on the master. The purpose of the gel pad, non-contact configuration is to eliminate any possible surface deformation incurred along the loading column and thereby avoid the elastic propagation of any deformations to the stamper resist surface.

The foregoing and other objects and advantages of the present invention will be apparent to those skilled in the art, in view of the following detailed description of the present invention, taken in conjunction with the appended claims and the accompanying drawings.

BRIEF DESCRIPTION OF THE DRAWINGS

So that the manner in which the features and advantages of the invention, as well as others which will become apparent are attained and can be understood in more detail, more particular description of the invention briefly summarized above may be had by reference to the embodiment thereof which is illustrated in the appended drawings, which drawings form a part of this specification. It is to be noted, however, that the drawings illustrate only an embodiment of the invention and therefore are not to be considered limiting of its scope as the invention may admit to other equally effective embodiments.

DETAILED DESCRIPTION OF THE INVENTION

Figure 1:
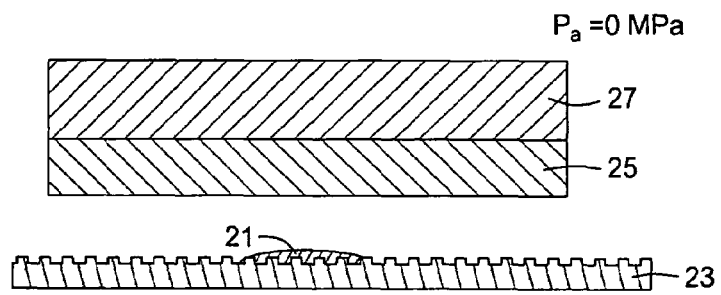
FIGS. 1-4 are sectional views of a conventional daughter stamper fabrication process illustrating a sequence of manufacture thereof.
Figure 2:
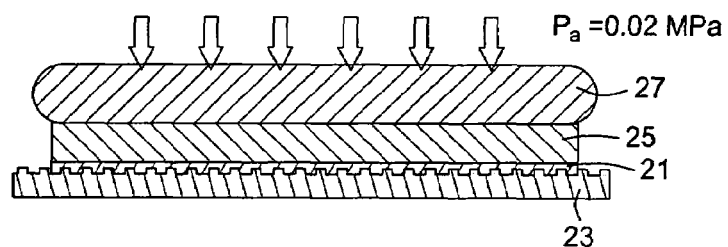
Figure 3:
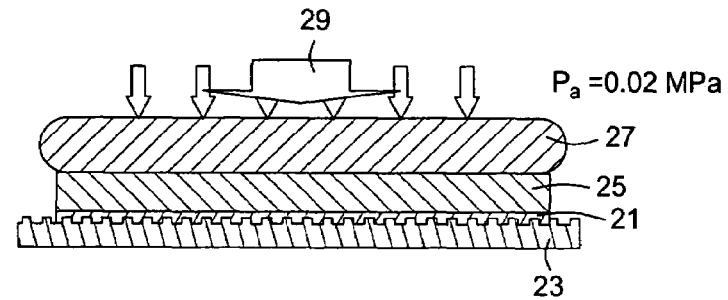
Figure 4:
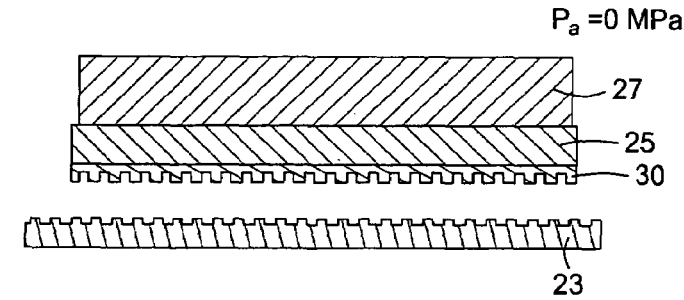
Figure 5:
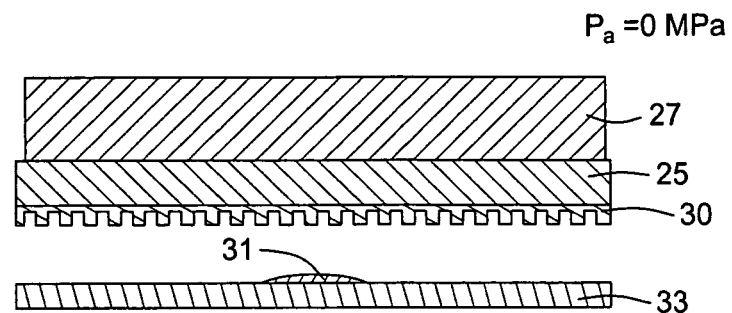
FIGS. 5-8 are sectional views of a conventional disk replica imprinting process illustrating a sequence of manufacture thereof.
Figure 6:
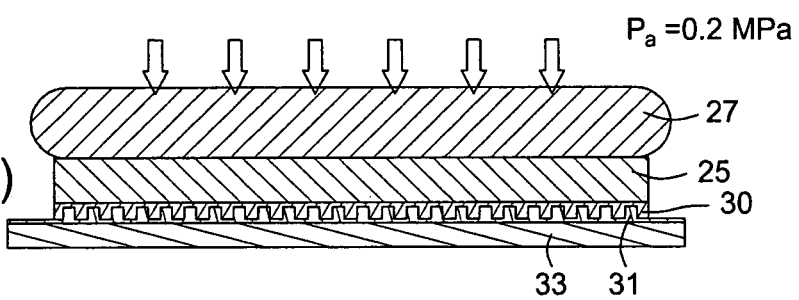
Figure 7:
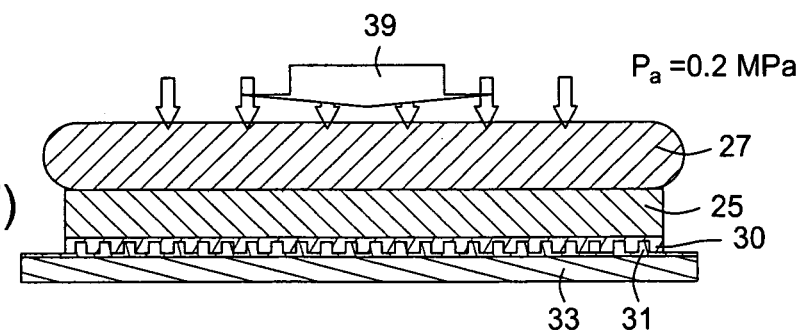
Figure 8:
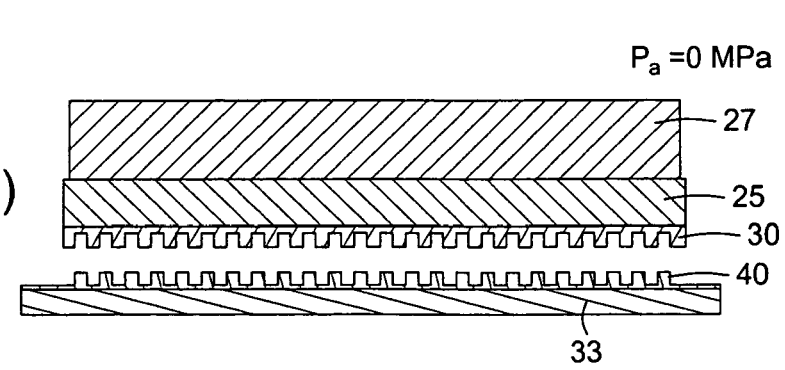
Figure 9:
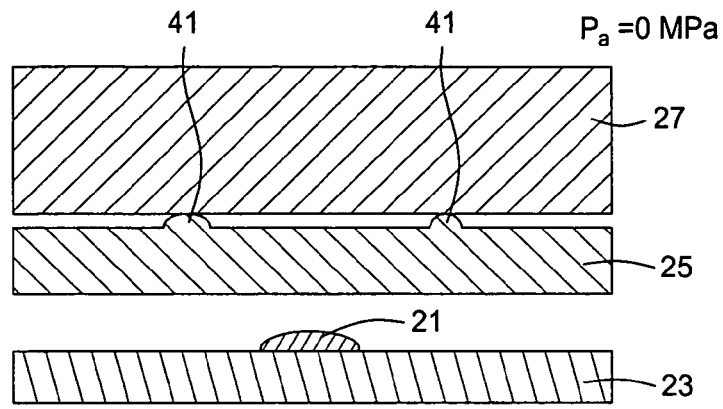
FIGS. 9-11 are sectional views illustrating the formation of undesirable stamper surface dimples.
Figure 10:
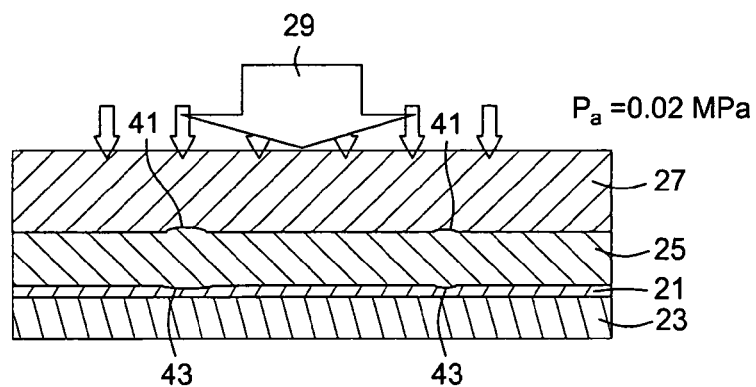
Figure 11:
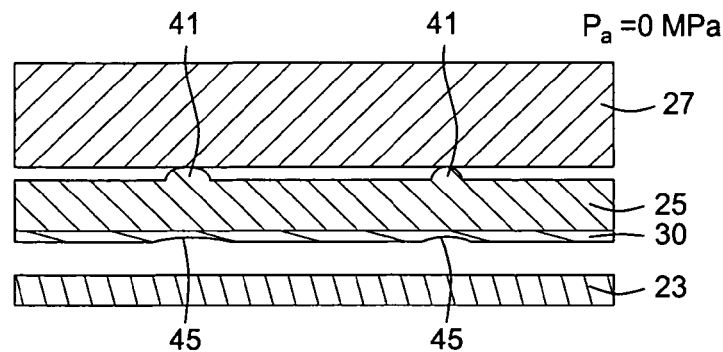
Figure 12:
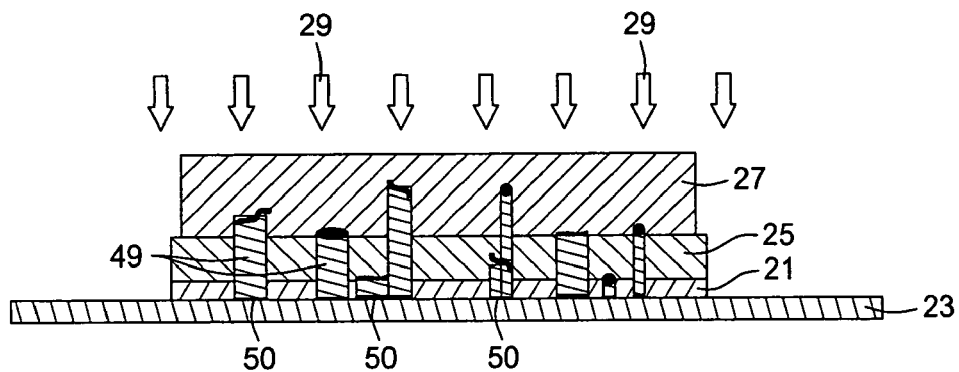
FIG. 12 is a sectional view illustrating the formation of undesirable UV light shadowing on the stamper layer.

Referring to FIGS. 13-16, one embodiment of a system, method, and apparatus for photopolymer stamper fabrication constructed in accordance with the present invention is shown. The present invention comprises a membrane support 101 (FIG. 13) having an opening 103. A membrane 105 is mounted to the membrane support 101 such that the membrane 105 extends and seals across the opening 103 in the membrane support 101. A plate 107, formed from a material such as quartz, is located adjacent the membrane 105 for permitting at least some UV light to pass therethrough. The plate has an axis 109 and extends in a radial direction.

Figure 13:
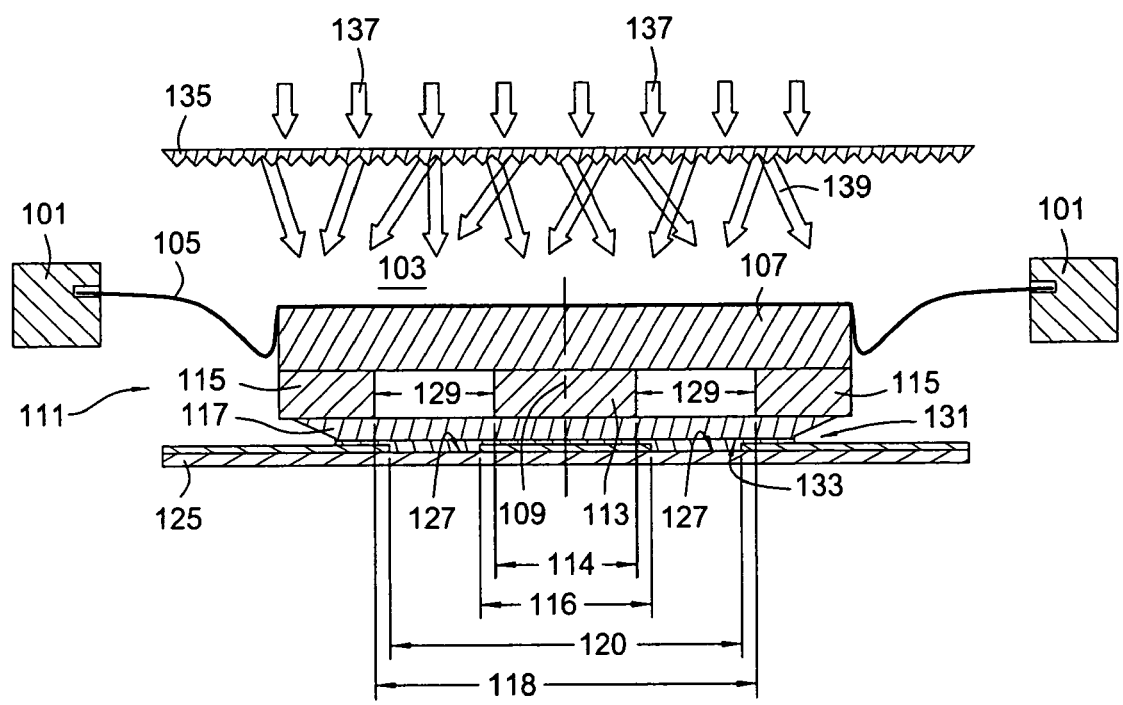
FIG. 13 is a sectional view of one embodiment of a non-contact, UV diffuser imprinting process constructed in accordance with the present invention.
Figure 14:
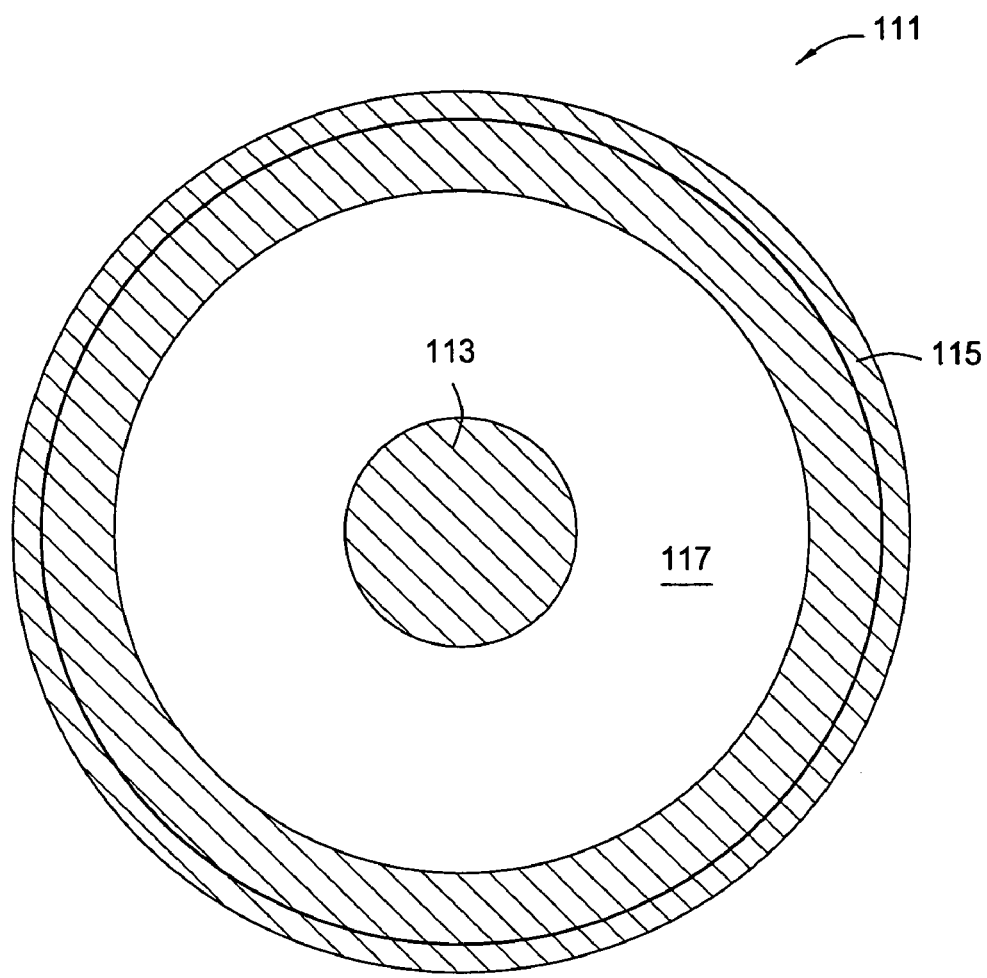
FIGS. 14 and 15 are top and sectional views, respectively, of a gel pad and stamper backing plate utilized in the process of FIG. 13 and are constructed in accordance with the present invention.
Figure 15:
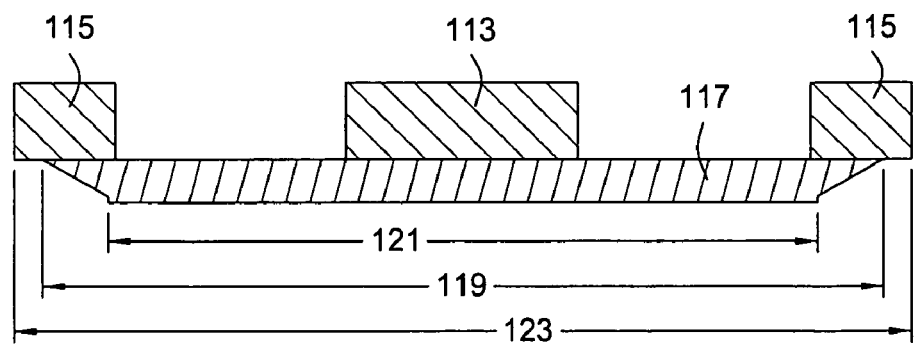

As shown in FIGS. 13-15, a gel pad 111 is mounted to the plate 107. In one embodiment, the gel pad comprises two pieces, including a cylindrical inner portion 113 that is axially aligned with the plate 107, and a ring-like outer portion 115 that is radially spaced apart from and axially aligned with the inner portion 113. A stamper backing plate or daughter stamper 117 is mounted to the gel pad 111. In one embodiment, the stamper 117 is generally frustoconical in shape and has an upper surface with a diameter 119 (FIG. 15) that exceeds a diameter 121 of a lower surface, as shown. A maximum diameter 123 of the gel pad 111 exceeds a maximum diameter 119 of the stamper 117.

Referring again to FIG. 13, a master 125 is located adjacent the daughter stamper 117 opposite the gel pad 111 and has a contact surface 127 with imprint features. A radial space 129 defined between the inner and outer portions 113, 115 of the gel pad 111 coincides with a radial position of the imprint features on the contact surface 127 of the master 125. During fabrication, a layer of photopolymer resist 131 is located between the master 125 and the daughter stamper 117 for forming a pattern 133 on the daughter stamper 117 from the patterned zone on the master 125.

In one embodiment (FIG. 13), the outer diameter 114 of inner portion 113 is equal to or smaller than the inner diameter 116 of the pattern 133 (i.e., the patterned zone), and the inner diameter 118 of the outer portion 115 is equal to or larger than the outer diameter 120 of the pattern 133 or patterned zone. Thus, the gel pad 111 is not radially located over the pattern 133, so that neither the inner portion 113 nor the outer portion 115 is located over the pattern 133.

The present invention also comprises a UV beam diffuser 135 that is located adjacent the membrane 105 and opposite the plate 107 for diffusing a collimated UV incident beam 137 into a randomized UV incident beam 139 at the photopolymer resist 131.

Figure 16:
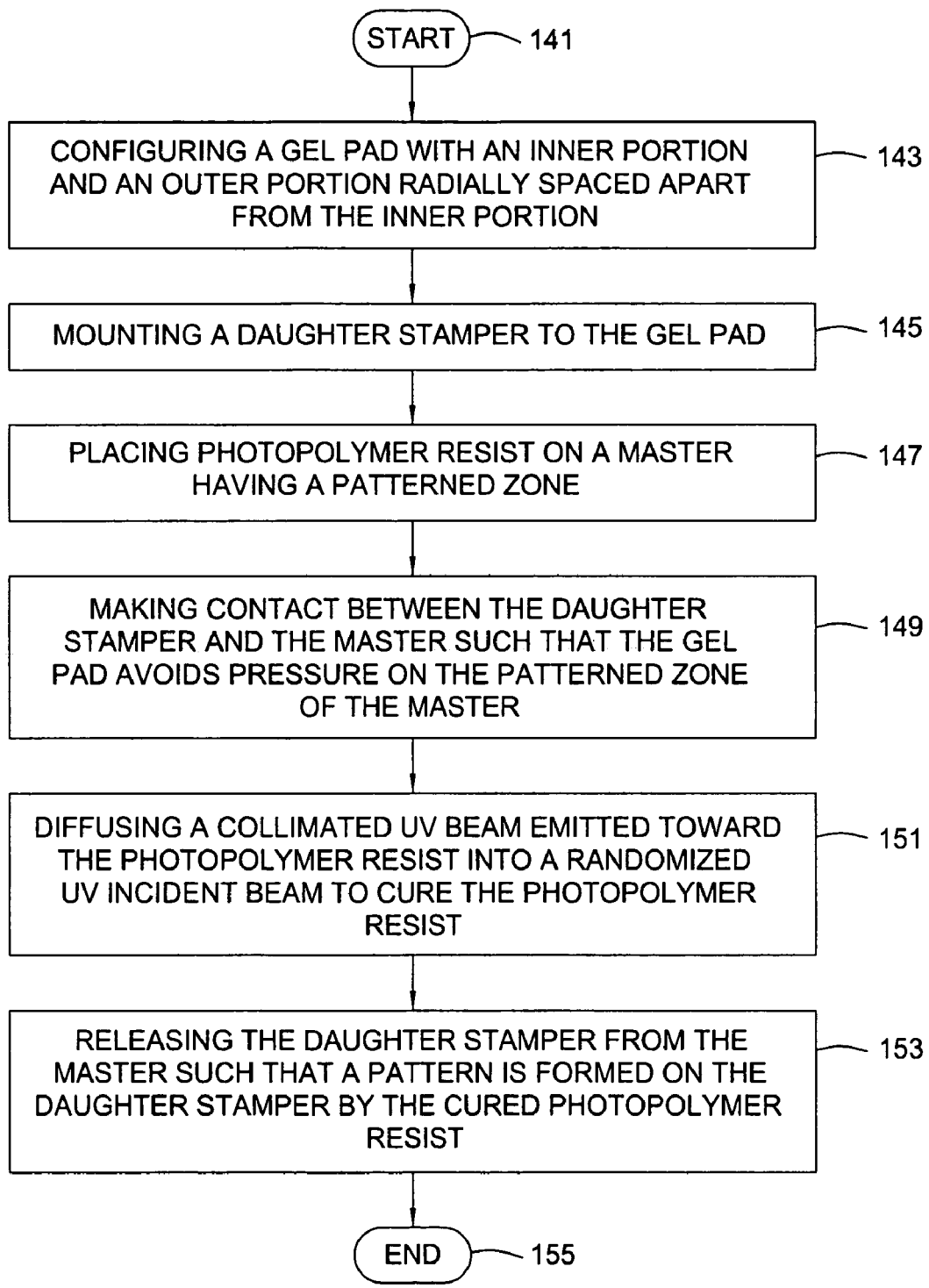
FIG. 16 is a high level flow diagram of one embodiment of a method constructed in accordance with the present invention.

The present invention further comprises a method of fabricating a photopolymer stamper. As shown in FIG. 16, the method begins as indicated at step 141, and comprises configuring a gel pad with an inner portion and an outer portion radially spaced apart from the inner portion (step 143); mounting a daughter stamper (e.g., backing plate) to the gel pad (step 145); placing photopolymer resist on a master having a patterned zone (step 147); making contact (e.g., under pressure that deforms the membrane 105 and presses the imprinting column together) between the daughter stamper 117 and the master 125 such that the gel pad 111 avoids pressure on the patterned zone 127 of the master 125 (step 149); diffusing a collimated UV beam emitted toward the photopolymer resist into a randomized UV incident beam to cure the photopolymer resist (step 151); releasing the daughter stamper from the master such that a pattern is formed on the daughter stamper by the cured photopolymer resist (step 153); before ending as indicated at step 155.

The method may further comprise configuring the inner portion of the gel pad as cylindrical, and the outer portion of the gel pad as a ring-like shape that is axially aligned with the inner portion; defining a radial space between the inner and outer portions of the gel pad to coincide with a radial position of the patterned zone of the master; and/or configuring a maximum diameter of the gel pad to exceed a maximum diameter of the stamper, and configuring the stamper with a frustoconical shape having an upper surface with a diameter that exceeds a diameter of a lower surface.

The present invention has several advantages, including the ability to provide a unique non-contact and diffuser exposure stamper fabrication method that enables the photopolymer daughter stamper methodology to yield high quality imprinted disk replicas. The diffuser diffuses collimated UV light exposure despite the presence of contaminant particles, debris, fibers, or surface scratches that can project their shadows onto the stamp resist/master interface. By overcoming this shadowing effect, the UV light intensity is not locally modified and the curing kinetics of the stamper resist are uninfluenced. This solution eliminates debris-induced stamper surface non-uniformities, such as surface dimples, trenches, etc.

While the invention has been shown or described in only some of its forms, it should be apparent to those skilled in the art that it is not so limited, but is susceptible to various changes without departing from the scope of the invention.

What is claimed is:

1. An imprinting apparatus, comprising:
    a membrane support having an opening;
        a membrane mounted to the membrane support such that the membrane extends and seals across the opening in the membrane support;
        a plate located adjacent the membrane for permitting at least some UV light to pass therethrough, the plate having an axis and extending in a radial direction;
        a gel pad mounted to the plate;
        a stamper mounted to the gel pad;
    a master located adjacent the stamper opposite the gel pad and having a contact surface with imprint features; and
        a UV beam diffuser located adjacent the membrane and opposite the plate for diffusing a collimated UV incident beam into a randomized UV incident beam.

2. An imprinting apparatus according to claim 1, wherein the gel pad comprises two pieces including an inner portion that is axially aligned with the plate and stamper, and an outer portion that is radially spaced apart from the inner portion.

3. An imprinting apparatus according to claim 2, wherein the inner portion of the gel pad is cylindrical, the outer portion of the gel pad has a ring-like shape and is axially aligned with the inner portion.

4. An imprinting apparatus according to claim 2, wherein a radial space defined between the inner and outer portions of the gel pad coincides with a radial position of the imprint features on the contact surface of the master.

5. An imprinting apparatus according to claim 2, wherein an outer diameter of the inner portion of the gel pad is equal to or less than an inner diameter of the imprint features, and an inner diameter of the outer portion of the gel pad is greater than or equal to an outer diameter of the imprint features.

6. An imprinting apparatus according to claim 1, wherein a maximum diameter of the gel pad exceeds a maximum diameter of the stamper.

7. An imprinting apparatus according to claim 1, wherein the stamper is frustoconical in shape and has an upper surface with a diameter that exceeds a diameter of a lower surface.

8. An imprinting system for photopolymer stamper fabrication, comprising:
    a membrane support having an opening;
        a membrane mounted to the membrane support such that the membrane extends and seals across the opening in the membrane support;
        a plate located adjacent the membrane for permitting at least some UV light to pass therethrough, the plate having an axis and extending in a radial direction;
        a gel pad mounted to the plate and comprising an inner portion that is axially aligned with the plate, and an outer portion that is radially spaced apart from the inner portion;
        a daughter stamper mounted to the gel pad;
    a master located adjacent the daughter stamper opposite the gel pad and having a contact surface with imprint features; and
    a layer of photopolymer resist located between the master and the daughter stamper for forming a pattern on the daughter stamper.

9. An imprinting system according to claim 8, a UV beam diffuser located adjacent the membrane and opposite the plate for diffusing a collimated UV incident beam into a randomized UV incident beam at the photopolymer resist.

10. An imprinting system according to claim 8, wherein the inner portion of the gel pad is cylindrical, the outer portion of the gel pad has a ring-like shape and is axially aligned with the inner portion.

11. An imprinting system according to claim 8, wherein a radial space defined between the inner and outer portions of the gel pad coincides with a radial position of the imprint features on the contact surface of the master.

12. An imprinting system according to claim 8, wherein an outer diameter of the inner portion of the gel pad is equal to or less than an inner diameter of the imprint features, and an inner diameter of the outer portion of the gel pad is greater than or equal to an outer diameter of the imprint features.

13. An imprinting system according to claim 8, wherein a maximum diameter of the gel pad exceeds a maximum diameter of the stamper.

14. An imprinting system according to claim 8, wherein the stamper is frustoconical in shape and has an upper surface with a diameter that exceeds a diameter of a lower surface.

* * * * *